(12) United States Patent
Tang et al.

(10) Patent No.: US 10,382,013 B2
(45) Date of Patent: Aug. 13, 2019

(54) PULSE-WIDTH MODULATION VOLTAGE IDENTIFICATION INTERFACE

(71) Applicant: Altera Corporation, San Jose, CA (US)

(72) Inventors: Lai Guan Tang, Tanjung Bungah (MY); Kris Dehnel, Cedar Park, TX (US); Benoit Herve, San Jose, CA (US)

(73) Assignee: Altera Corporation, San Jose, CA (US)

( * ) Notice: Subject to any disclaimer, the term of this patent is extended or adjusted under 35 U.S.C. 154(b) by 210 days.

(21) Appl. No.: 15/087,892

(22) Filed: Mar. 31, 2016

(65) Prior Publication Data

US 2017/0288648 A1    Oct. 5, 2017

Related U.S. Application Data

(60) Provisional application No. 62/245,873, filed on Oct. 23, 2015.

(51) Int. Cl.
*H03K 3/012* (2006.01)
*H03K 3/017* (2006.01)
*H03K 5/003* (2006.01)

(52) U.S. Cl.
CPC ............. *H03K 3/012* (2013.01); *H03K 3/017* (2013.01); *H03K 5/003* (2013.01)

(58) Field of Classification Search
CPC ....... H03K 3/012; H03K 3/017; H02M 3/155; H02M 2001/0048; H02M 3/00; H02M 3/02; H02M 3/04; H02M 3/06; H02M 3/07; H02M 3/08; H02M 3/10; H02M 3/125

USPC .......................................................... 327/175
See application file for complete search history.

(56) References Cited

U.S. PATENT DOCUMENTS

| | | | |
|---|---|---|---|
| 2007/0085558 A1 | 4/2007 | Rahim et al. | |
| 2008/0098224 A1 | 4/2008 | Hui et al. | |
| 2008/0106248 A1 | 5/2008 | Qahouq et al. | |
| 2012/0109550 A1* | 5/2012 | Naffziger | G06F 1/3206 702/61 |

(Continued)

FOREIGN PATENT DOCUMENTS

EP      2642367 A2    9/2013
JP      H07130184 A   5/1995

OTHER PUBLICATIONS

Extended EP Search Report for EP Application No. 16195124 dated Mar. 8, 2017; 7 Pages.

(Continued)

*Primary Examiner* — Patrick C Chen
(74) *Attorney, Agent, or Firm* — Fletcher Yoder P.C.

(57) ABSTRACT

Systems, methods, and devices for voltage identification using a pulse-width modulation signal are provided. Such an integrated circuit device may include an input/output (I/O) interface and voltage identification (VID) circuitry. The VID circuitry may be coupled to the input/output interface. The voltage identification circuitry may generate a voltage identification signal that is output on the input/output interface. The voltage identification signal may include a pulsed signal having a particular duty cycle that corresponds to a specified voltage level to enable a voltage regulator that receives the voltage identification signal to provide an input voltage to the integrated circuit device at the specified voltage level.

20 Claims, 7 Drawing Sheets

(56) References Cited

U.S. PATENT DOCUMENTS

2013/0249290 A1    9/2013  Buonpane et al.
2016/0164500 A1*   6/2016  Nene ................... H02M 3/158
                                                       327/175

OTHER PUBLICATIONS

First Office Action for CN Application No. 201611121234.7 dated Apr. 23, 2019.

* cited by examiner

PULSE-WIDTH MODULATION VOLTAGE IDENTIFICATION INTERFACE

CROSS-REFERENCE TO RELATED APPLICATIONS

This application claims the benefit of and priority to U.S. Provisional Patent Application No. 62/245,873, "Pulse-Width Modulation Voltage Identification Interface," filed on 23 Oct. 2015, which is incorporated by reference in its entirety for all purposes.

BACKGROUND

This disclosure relates to integrated circuit devices and, more particularly, to generating and providing a pulse-width modulated signal to specify the supply voltage from a voltage regulator that supplies the integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Demands for efficient power management within integrated circuit (IC) devices increase with every new generation of integrated circuit devices. In fact, many of the latest generation of integrated circuit devices include multiple power saving features that enable efficient power usage management. One of the power saving features that may be included in integrated circuit devices is selectively activating various portions of circuits. Another power saving feature that may be included is supplying various supply voltage levels to different circuits according to specified performance levels of the different circuits. Some integrated circuit devices may include a "smart" power saving feature. The smart power saving feature includes a smart controller that controls requests to power supplies to different portions of an integrated circuit device. The smart power saving features help to maintain the performance of the integrated circuit device to a high level while using a relatively low voltage level. One example of a smart power saving feature is SmartVID® from Altera Corporation.

The smart power saving features may use an interface that communicates between a voltage regulator and the integrated circuit device. Due to the complexity of the power saving features, the interface may use parallel wires between the power saving features within the integrated circuit device and the voltage regulator. Parallel communication, however, may add complexity in both its commands and its routing connections between the integrated circuit device and the voltage regulator.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments described herein include a pulse-width modulation (PWM) interface that generates pulsed signals of a particular duty cycle and a method of operating the pulse-width modulation interface. It should be appreciated that the embodiments can be implemented in numerous ways, such as a process, an apparatus, a system, a device, or a method. Several embodiments are described below.

In one embodiment, an integrated circuit device includes an input/output (I/O) interface and voltage identification (VID) circuitry. The VID circuitry is coupled to the input/output interface. The voltage identification circuitry may generate a voltage identification signal that is output on the input/output interface. The voltage identification signal may include a pulsed signal having a particular duty cycle that corresponds to a specified voltage level to enable a voltage regulator that receives the voltage identification signal to provide an input voltage to the integrated circuit device at the specified voltage level.

In another embodiment, a circuit system includes an integrated circuit device and a voltage regulator device. The integrated circuit device may generate pulsed signals having a particular duty cycle that is selected from a group of predefined duty cycle pulsed signals. In one embodiment, the integrated circuit device may be similar to the above-mentioned embodiment. The voltage regulator circuit may be coupled to the integrated circuit device through a serial communication link. In addition to that, the voltage regulator circuit receives the pulsed signals having the particular duty cycle from the integrated circuit device through the serial communication link. The voltage regulator circuit may generate a voltage signal of a particular voltage level that corresponds to the pulsed signals having the particular duty cycle.

In an another embodiment, a method of operating an integrated circuit device to control a voltage regulator circuit may include generating pulsed signals having a particular duty cycle that is based on a particular function. In addition, the method may include transmitting the pulsed signals having the particular duty cycle out of the integrated circuit device. The pulsed signals may be transmitted to the voltage regulator device.

Further features of the disclosure, its nature and various advantages will be more apparent from the accompanying drawings and the following detailed description. Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

The following embodiments include a pulse-width modulation (PWM) interface that generates pulsed signals of a particular duty cycle and a method of operating the pulse-width modulation interface. The embodiments may be practiced without some or all of these specific details. In other instances, well-known operations have not been described in detail in order not to obscure the present embodiments.

Throughout this specification, when an element is referred to as being "connected" or "coupled" to another element, it may be directly connected or coupled to the other element or electrically connected or coupled to the other element with yet another element interposed between them.

Figure 1:
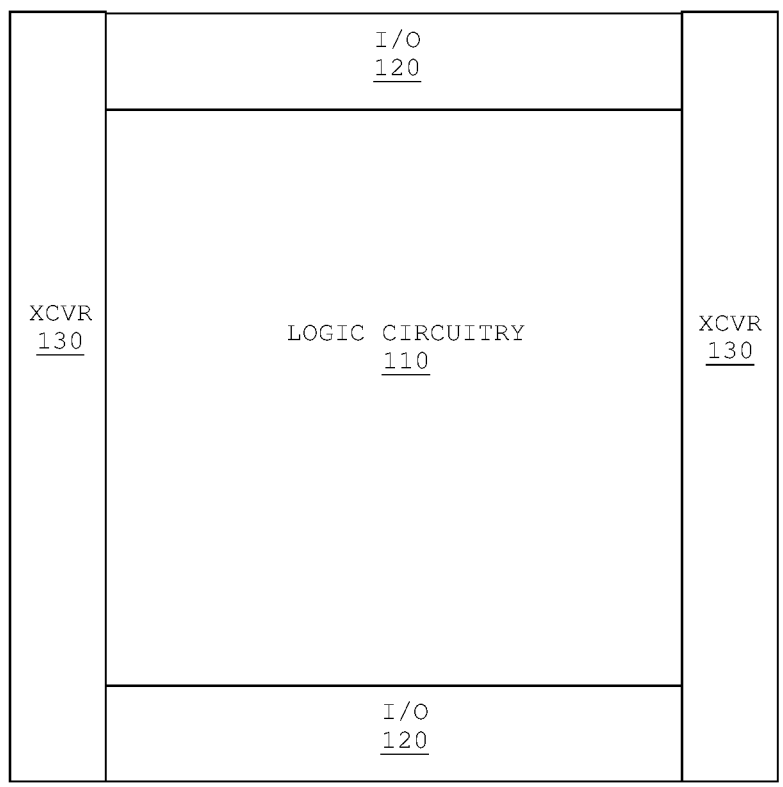
FIG. 1 shows an illustrative integrated circuit device in accordance with an embodiment.

FIG. 1, meant to be illustrative and not limiting, illustrates an integrated circuit device in accordance with an embodiment. Integrated circuit (IC) device 100 includes logic circuitry 110 and input/output (I/O) circuits 120 and transceiver (XCVR) circuits 130. In one embodiment, integrated circuit device 100 may be an application specific integrated circuit (ASIC) device, an application standard specific product (ASSP) device, a programmable logic device (PLD) or a microprocessor device. In general, the ASIC, ASSP and microprocessor devices may perform fixed and dedicated functions. The PLD devices may be programmable to perform a variety of functions. An example of a PLD device may be a field programmable gate array (FPGA) device.

Integrated circuit device 100 may be used in different types of high speed systems, for example a communication system such as wireless systems, wired systems, etc. In one embodiment, integrated circuit device 100 may be a PLD that is utilized for controlling data transfer between different devices, for example, a microprocessor device and a memory device. Hence, integrated circuit device 100 may include circuits that may be used to implement various transmission standards that allow integrated circuit device 100 to communicate with external devices such as memory devices (not shown), which may be coupled to integrated circuit device 100.

As part of a circuit system, integrated circuit device 100 may be coupled to multiple external devices. In one circuit system, integrated circuit device 100 may be coupled to one or more voltage regulating devices (not shown). In one embodiment, the voltage regulator may be a digital voltage regulator. In an alternative embodiment, the voltage regulator may be an analog voltage regulator.

Integrated circuit device 100 in the abovementioned circuit system may control the voltage regulator(s) in order to generate appropriate voltage levels. In one embodiment, the digital voltage regulator may receive control signals that are in the form of digital signals from integrated circuit device 100 to generate a specific voltage level. Alternatively, the analog voltage regulator device may receive control signals that are in the form of analog signals from integrated circuit device 100, or digital signals which are converted to analog signals, to generate a specific voltage level.

In addition to that, integrated circuit device 100 may be coupled to the voltage regulator(s) using only a single interconnection (e.g., a wire). Integrated circuit device 100 may control the voltage regulator device using pulse-width modulated (PWM) signals. In one example, the PWM signals may be transmitted to the integrated circuit device 100 via a single control wire rather than via a larger number (e.g., 8) parallel control wires.

Referring still to FIG. 1, I/O circuits 120 and transceiver circuits 130 occupy the peripheral portion of integrated circuit device 100, whereas logic circuitry 110 occupies the center region of integrated circuit device 100. It should be appreciated that the arrangement of I/O circuits 120, transceiver circuits 130 and logic circuitry 110 on integrated circuit device 100 may vary depending on the requirements of a particular device and the preferences of a circuit designer.

In one embodiment, logic circuitry 110 may be utilized for performing core functions of integrated circuit device 100. Logic circuitry 110 may include specific circuitry for the functions that defines integrated circuit device 100. For example, logic circuitry 110 may include circuits that perform memory device addressing and processing of information retrieved from the memory device when integrated circuit device 100 is used as a memory controller.

In another example, logic circuitry 110 may include programmable logic elements when integrated circuit is a PLD. The programmable logic elements may further include circuits such as look-up table circuitry, multiplexers, product-term logic, registers, memory circuits and the like. The programmable logic elements may be programmed by a user (e.g., a designer or an engineer) to perform desired functions.

In one exemplary embodiment, logic circuitry 110 may be configured to include power saving features. One of the examples of the power saving features includes a voltage identification (VID) block (not shown). The voltage identification block determines the voltage levels that is needed by integrated circuit device 100 and generates a control signal for a voltage regulator. The control signal may be a pulse-width modulated (PWM) signal of a particular duty cycle, in one embodiment.

Logic circuitry 110 may also include multiple interconnections. The interconnections may be utilized to transfer a signal between two different circuits within logic circuitry 110. When integrated circuit device 100 is a PLD, logic circuitry may include programmable interconnections. Programmable interconnections may be configured to transfer a signal between a first circuit and a second circuit in one instance and between the first circuit and a third circuit in another instance.

I/O circuits 120 and transceiver circuits 130 may be utilized for transferring signals (i.e., a data) in to or out of integrated circuit device 100. For example, signals from logic circuitry 110 may be transferred out of integrated circuit device 100 through either one of the I/O circuits 120 or transceiver circuits 130. Additionally, signals received from an external device (external to integrated circuit device 100) may be transferred to logic circuitry 110 through one of the I/O circuits 120 or transceiver circuits 130. In one embodiment, I/O circuits 120 and transceiver circuits 130 may be considered as external interfacing circuitry of integrated circuit device 100. Signals may be transferred out or received by one of these I/O circuits 120 or transceiver circuits 130 via its pins (not shown).

Figure 2:
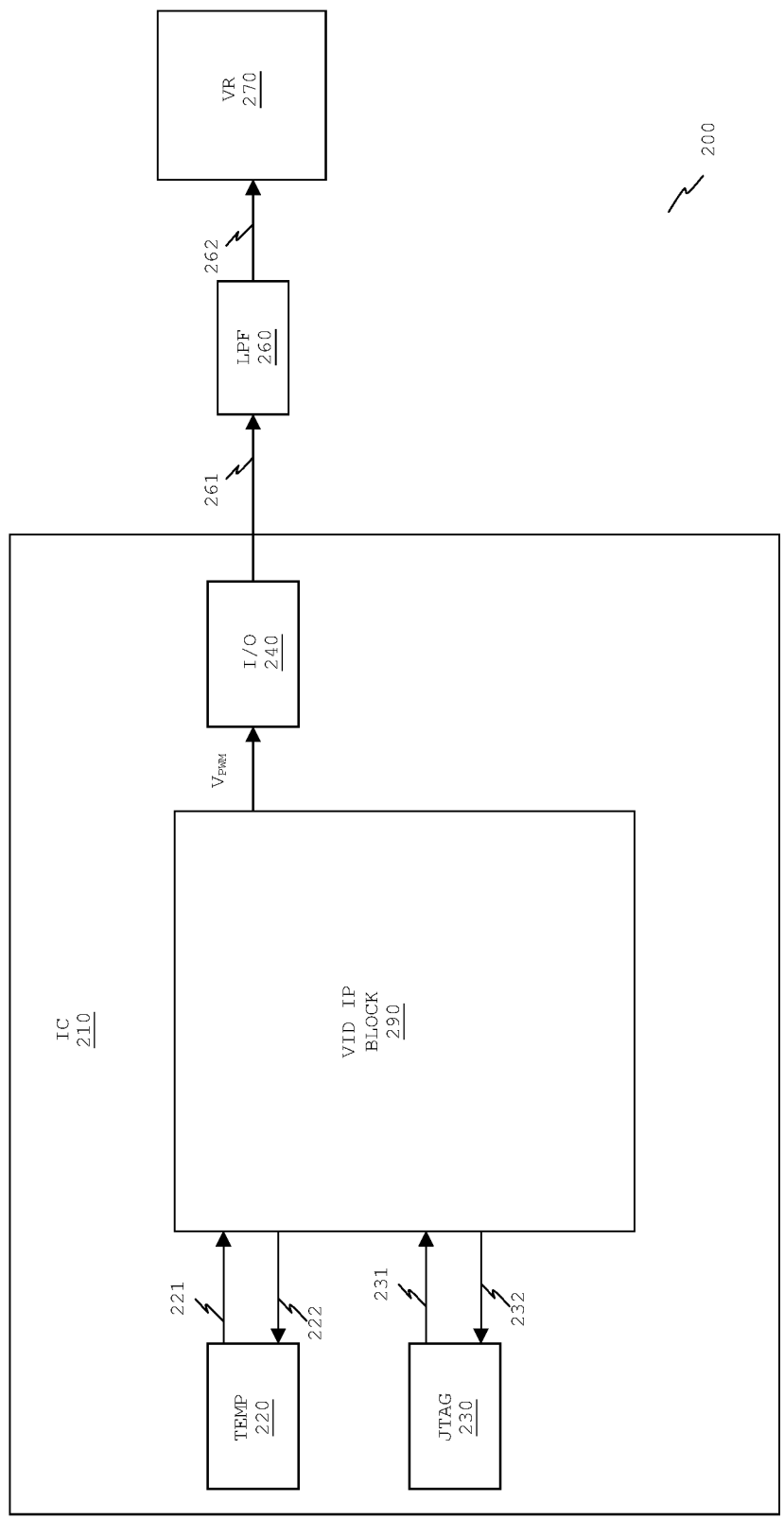
FIG. 2 shows an illustrative open-loop voltage regulating circuit system in accordance with an embodiment.

FIG. 2, meant to be illustrative and not limiting, illustrates an open-loop voltage regulating circuit system in accordance with one embodiment of the present disclosure. The open-loop voltage regulating circuit system 200 includes integrated circuit device 210, voltage regulator (VR) device 270, and low-pass filter (LPF) 260. However, it should be appreciated that there may be more than one voltage regulator devices, for example similar to voltage regulator device 270, in the open-loop voltage regulating circuit system 200.

In one embodiment, integrated circuit device 210 may be similar to integrated circuit device 100 of FIG. 1. Integrated circuit device 200 may include multiple circuit blocks, for example, voltage identification (VID) intellectual property (IP) block 290, temperature sensor block 220, joint test action group (JTAG) circuit block 230 and input/output (I/O) circuit block 240. When integrated circuit device 210 is a PLD, the circuit blocks shown in FIG. 2 may be implemented using programmable logic elements. Alternatively, when integrated circuit device 210 is an ASSP device or an ASIC device, the circuit blocks shown in FIG. 2 may be formed as hardened and fixed function circuits.

As shown in the embodiment of FIG. 2, temperature sensor block 220 and JTAG circuit block 230 are coupled to VID IP block 290. Temperature sensor block 220 may be coupled to VID block 290 through interconnections 221 and 222. JTAG circuit block 230 is coupled to VID IP block 290 through interconnections 231 and 232. When integrated circuit device 210 is a PLD, interconnections 221, 222, 231 and 232 may be programmable interconnections. Alternatively, when integrated circuit device 210 is an ASSP device or an ASIC device, interconnections 221, 222, 231 and 232 may be hardened signal interconnections.

In addition to that, VID IP block 290 is also coupled to I/O circuit block 240. I/O circuit block 240 is further coupled to LPF 260, which is coupled to voltage regulator device 270. The manner in which integrated circuit device 210 is coupled to voltage regulator device 270 without any feedback shows that circuit system 200 is an open-loop circuit system.

Temperature sensor block 220 may be coupled to VID IP block 290 through interconnections 221 and 222. Temperature sensor block 220 may measure a surrounding temperature and generate a temperature output signal that is proportional to the measured temperature. The temperature output signal may be transmitted to VID IP block 290 through interconnections 221. Temperature sensor block 220 may start measuring the surrounding temperature when a trigger signal is supplied by VID IP block 290 through interconnection 222.

JTAG circuit block 230 may also be coupled to VID IP block 290 through interconnections 231 and 232. JTAG circuit block 230 may be utilized to retrieve information on trimmed voltage levels based on blown fuses. It should be appreciated that the fuses may be blown (i.e., the voltage levels are trimmed) to offset a manufacturing variation. These fuses are generally blown when an integrated circuit device (e.g., integrated circuit device 210) undergoes a testing block in the manufacturing process. JTAG circuit block 230 may read this information through specialized circuitry (e.g., test mode circuitry). The information may then be transmitted to VID IP block 290 through interconnection 231. JTAG circuit block 230 may start retrieving the information when a trigger signal is supplied by VID IP block 290 through interconnection 232.

VID IP block 290 may generate pulsed signals ($V_{PWM}$) based on the inputs received from temperature sensor block 240 and JTAG circuit block 230. The pulsed signals may have a particular duty cycle. It should be appreciated that a duty cycle is a ratio of a period where a signal is at a high voltage level over a total signal period. The duty cycle value is generally shown in terms of percentage value. For example, if the pulsed signals are at a high voltage level for half of its signal period, then the duty cycle of the pulsed signals will be 50%. In another example, if the pulsed signals are at the high voltage level for only one tenth of its signal period, then the duty cycle of the signal will only be 10%.

VID IP block 290 may be capable of generating pulsed signals having a duty cycle that may correspond to a particular function. In one exemplary embodiment, the function includes that a duty cycle of the pulsed signals having a proportionally linear relationship with the measured temperature. Hence, when a new measured temperature is higher than a previous measured temperature, the duty cycle of the pulsed signals may be increased. Alternatively, when the new measured temperature is lower than a previous measured temperature, the duty cycle of the pulsed signals may be decreased.

In another exemplary embodiment, the duty cycle may be inversely proportional to the measured temperature. Hence, when a new measured temperature is higher than a previous measured temperature, the duty cycle of the pulsed signals may be decreased. Alternatively, when the new measured temperature is lower than a previous measured temperature, the duty cycle of the pulsed signals may be increased.

Alternatively, VID IP block 290 may be capable of generating pulsed signals having a particular duty cycle that is selected from a group of at least $2^N$ different duty cycles. In one embodiment, the group may include at least 64 different cycles when the value of N is 6. These 64 different duty cycles may be defined and stored within VID IP block 290. The selection of one of these duty cycles may be based on changes that are reflected through the information obtained from temperature sensor block 220 and JTAG circuit block 230.

Each pulsed signals may have a particular duty cycle corresponding to particular control information. For example, the pulsed signals having a first duty cycle may correspond to first control information and pulsed signals having a second duty cycle may correspond to second control information. Voltage regulator device 270, upon receiving the control information, may generate a corresponding voltage signal. The control information may either increase the voltage level to a higher value than the current voltage level or to decrease the voltage level to a lower value than the current voltage level.

In one exemplary embodiment, VID IP block 290 is capable of generating 64 different pulsed signals. Each of these 64 different pulsed signals may be a particular control signal. These control signals may control voltage regulator device 270 to generate a voltage signal that differs by at least 5 millivolt (mV). For example, the first control signal may generate a voltage signal having a voltage level of 0.9 V (i.e., nominal voltage level) and the second control signal may generate a voltage signal having a voltage level of 0.905 V.

As stated above, VID IP block 290 may generate the pulsed signals after receiving its information from temperature sensor block 220 and JTAG circuit block 230. Once the information is received, VID IP block 290 may generate the pulsed signals having a particular duty cycle based on, for example, a predefined set of duty cycles or a function. The predefined set of duty cycles may be, but not limited to, n discrete forms (e.g., 64 different types of duty cycle for the pulsed signals).

In one embodiment, when a temperature measured is lower than an expected temperature value, VID IP block 290 may generate pulsed signals having a particular duty cycle that corresponds to a request to increase the voltage levels of the voltage signal generated by voltage regulator device 270. Additionally or alternatively, when the temperature measured is higher than an expected temperature, VID IP block 290 may generate the pulsed signal having a particular duty cycle that corresponds to a request to decrease the voltage levels of the voltage signal generated by voltage regulator device 270.

The pulsed signals may be transmitted out of integrated circuit device 210 through an I/O circuit block 240. As stated in FIG. 1, I/O circuit block 240 may be similar to I/O circuitry 120 of FIG. 1. I/O circuit block 240 may be coupled to an I/O pin (not shown), which may be coupled to wire 261 that couples with LPF 260. As shown in the embodiment of FIG. 2, only one wire is needed to transmit the pulsed signals out through I/O circuit block 240. In one embodiment, the manner in which voltage regulator device 270 is coupled to integrated circuit device 210 through wire 261 is a serial communication link.

In the embodiment of FIG. 2, LPF 260 may be formed between integrated circuit device 210 and voltage regulator device 270 within circuit system 200. LPF 260 may be coupled to I/O circuit block 240 through wire 261 and coupled to voltage regulator device through wire 262. In another embodiment (not shown), integrated circuit device 210 may be directly coupled to voltage regulator device 270 (i.e., without LPF 260).

It should be appreciated that LPF 260 allows signals having frequency values lower than a certain cut-off frequency to pass through, attenuates signals having frequency values higher than the cut-off frequency, and averages signals having a frequency that is substantially higher than the cut-off frequency of LPF 260. In addition to that, LPF 260 may also be chosen in such manner as to limit changing rate of voltage signal generated by voltage regulator 270 to a predetermined maximum slew-rate.

Still referring to FIG. 2, voltage regulator device 270 may be similar to the exemplary embodiment mentioned in FIG. 1. Voltage regulator device 270 may receive an output from LPF 260. Voltage regulator device 270 may include circuitry to decode the received pulsed signals with the particular duty cycle into a specific instruction. In one exemplary embodiment, the specific instruction may include an instruction to increase the voltage level of the voltage signal or to decrease the voltage level of the voltage signal. It should be appreciated that there are many ways to decode the received pulsed signals. In one exemplary embodiment, the decoding may be performed by matching the duty cycle of the received pulsed signals to a duty cycle from a predefined group of duty cycles. Each one of the duty cycle in the predefined group of duty cycles may correspond to an instruction on whether to increase/decrease the voltage level of the voltage signals.

Hence, when VID IP block 290 generates pulsed signals that may correspond to increasing the voltage levels, voltage regulator device 270 may increase the voltage levels of the voltage signal. Alternatively, when VID IP block 290 generates pulsed signals that may correspond to decreasing the voltage levels, voltage regulator device 270 may decrease the voltage levels of the voltage signal.

Generally, voltage regulator device 270 generates a particular voltage (e.g., a nominal voltage of 0.9 V) for integrated circuit device 210. However, with varying conditions (e.g., the surrounding temperature), voltage regulator device 270 may be required to generate different voltage levels signals.

It should be appreciated that the pulsed signals having a particular duty cycle may also be transmitted to voltage regulator device 270 to control other parameters of voltage regulator device 270 than the voltage levels of the voltage signal. In one embodiment, the other parameters of voltage regulator device 270 that can be controlled using pulsed signals may include limiting electrical current generated by voltage regulator device 270, changing a ramp time of the voltage signal that is generated by voltage regulator device 270 or compensating voltage levels of a voltage signal generated by voltage regulator device 270.

Figure 3:
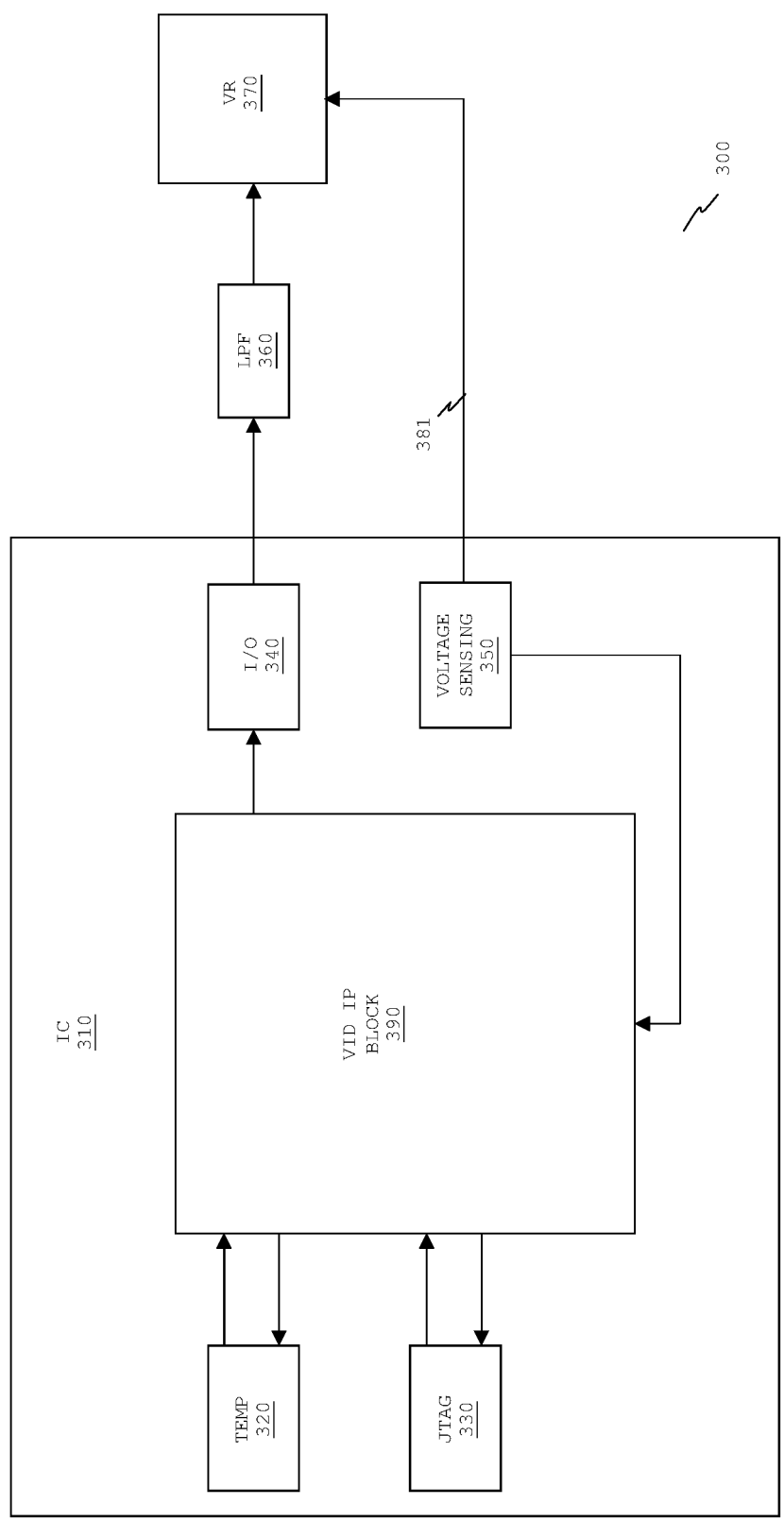
FIG. 3 shows an illustrative closed-loop voltage regulating circuit system in accordance with an embodiment.

FIG. 3, meant to be illustrative and not limiting, shows a closed-loop voltage regulating circuit system in accordance with one embodiment of the present disclosure. Similar to the open-loop voltage regulating circuit system 200 of FIG. 2, the closed-loop voltage regulating circuit system 300 includes integrated circuit device 310, voltage regulator (VR) device 370, and low-pass filter (LPF) 360. However, the closed-loop voltage regulating circuit system 300 further includes an additional wire 381 that feeds back voltage signals generated by voltage regulator device 370. Similar to FIG. 2, it should be appreciated that there may be more than one voltage regulator devices, for example similar to voltage regulator device 370, in the closed-loop voltage regulating circuit system 300.

In one embodiment, integrated circuit device 310 may be similar to integrated circuit device 210 of FIG. 2 with an additional voltage sensing circuitry 350. Voltage sensing circuitry 350 includes an analog-to-digital converter (ADC) circuit. Voltage regulator device 370 and low-pass filter 360 may be similar to voltage regulator device 270 and low-pass filter 260 of FIG. 2. Voltage identification (VID) intellectual property (IP) block 390, temperature sensor block 320, joint test action group (JTAG) block 330 and input/output (I/O) circuit block 340 may also be similar to VID IP block 290, temperature sensor block 220, JTAG circuit block 230 and I/O circuit block 240, respectively, of FIG. 2. Therefore, for the sake of brevity, details of voltage regulator device 370, low-pass filter 360, VID IP block 390, temperature sensor block 320, JTAG circuit block 330, and I/O circuit block 340 will not be repeated.

As shown in the embodiment of FIG. 3, VID IP block 390 is also coupled to I/O circuit block 340 and voltage sensing circuitry 350. I/O circuit block 340 is further coupled to LPF 360, which is coupled to voltage regulator device 370. Voltage sensing circuitry 350 is also coupled to voltage regulator device 370. The manner in which integrated circuit device 310 is coupled to voltage regulator device 370 with a feedback loop through wire 381 going through voltage sensing circuitry 350 shows that circuit system 200 is a closed-loop circuit system.

As shown in FIG. 3, ADC circuit block within voltage sensing circuitry 350 forms an intermediate circuit between voltage regulator device 370 and VID IP block 390. ADC circuit block may convert an analog signal (i.e., the voltage signal generated by voltage regulator device 370) having a particular voltage level to a digital signal. In one embodiment, the conversion from an analog signal to a digital signal may be performed by sampling and digitizing the analog signal. The digital signal may then be transmitted to VID IP block 390. The digital signal generated by ADC circuit block may also be referred to as a feedback signal. The feedback signal is transmitted to VID IP block 290 to generate a control signal, which may either have information to increase or decrease the voltage levels of a voltage signal ($V_{Vr}$) generated by voltage regulator device 370.

Furthermore, VID IP block 390 may generate the pulsed signals after receiving its information from temperature sensor block 320, JTAG circuit block 330 and voltage sensing circuitry 350. In one embodiment, VID IP block 290 may generate the pulsed signals having a particular duty cycle based on a difference between an expected voltage level of a voltage signal generated by voltage regulator device 370 and the voltage level that was fed back into VID IP block 390 through voltage sensing circuitry 350. It should be appreciated that such method to generate the pulsed signals may also be referred to as an error-based method of generating the pulsed signals, since it is based on the differences between an expected voltage level and the current voltage level of the voltage signal.

In one exemplary embodiment, when the feedback voltage level of the voltage signal is lower than an expected voltage level of the voltage signal, VID IP block 390 may generate pulsed signals having a duty cycle that may correspond to a request for increasing voltage levels of the voltage signal generated by voltage regulator device 370. Alternatively, when the feedback voltage level of the voltage signal is higher than an expected voltage level of the voltage signal, VID IP block 390 may generate the pulsed signal having a particular duty cycle that corresponds to a request for decreasing the voltage levels of the voltage signal generated by voltage regulator device 370.

Similar to embodiment of FIG. 2, it should be appreciated that the pulsed signals having a particular duty cycle may be transmitted to voltage regulator device 370 to control other parameters of voltage regulator device 370. In one embodiment, the other parameters of voltage regulator device 370 that can be controlled using pulsed signals include limiting electrical generated at voltage regulator device 370, changing a ramp time of the voltage signal generated by voltage regulator device 270 or compensating voltage level of a voltage signal generated by voltage regulator device 370.

Figure 4:
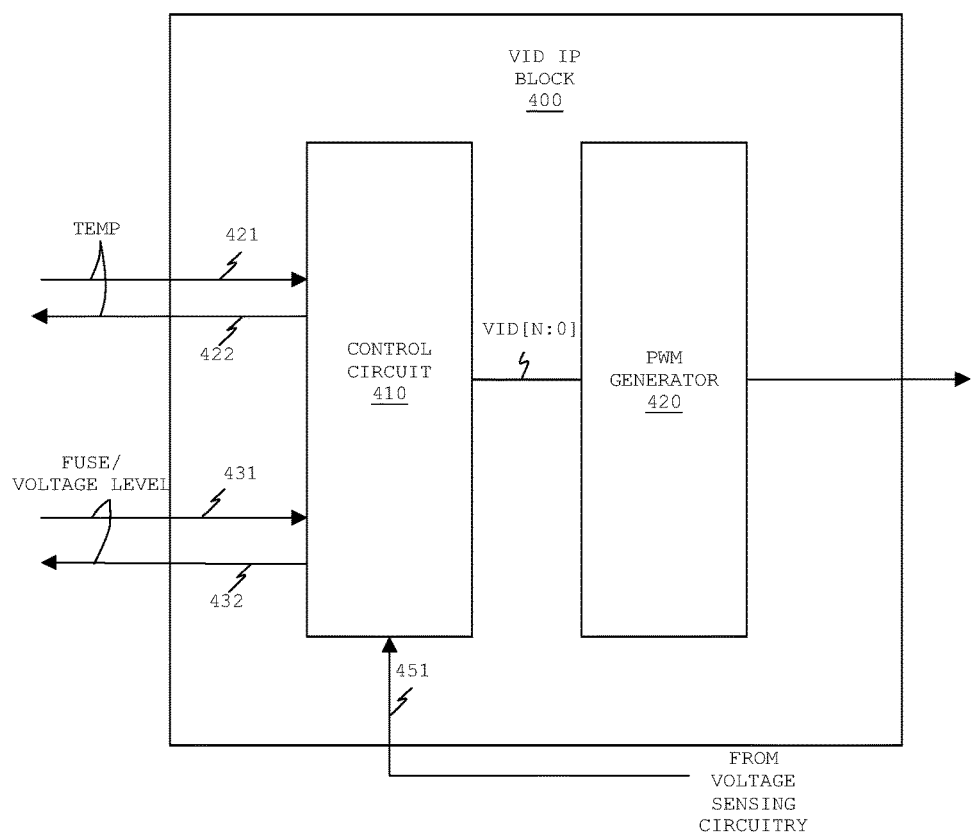
FIG. 4 shows further details of an illustrative voltage identification (VID) intellectual property (IP) block in accordance with an embodiment.

FIG. 4, meant to be illustrative and not limiting, illustrates further details of a voltage identification (VID) intellectual property (IP) block in accordance with one embodiment of the present disclosure. In one embodiment, VID IP block 400 may be similar to VID IP block 290 of FIG. 2 or VID IP block 390 of FIG. 3. Therefore, VID IP block 400 may be formed on integrated circuit device 100 of FIG. 1, integrated circuit device 210 of FIG. 2 or integrated circuit device 310 of FIG. 3.

Similar to VIP IP block 290 of FIG. 2 and VID IP block 390 of FIG. 3, VID IP block 400 may be utilized to generate pulsed signals having a particular duty cycle. Further, VID IP block 400 may be coupled to a temperature sensor block (e.g., temperature sensor block 220 of FIG. 2 or temperature sensor block 320 of FIG. 3) through interconnections 421 and 422 and may be coupled to a JTAG circuit block (e.g., JTAG circuit block 230 of FIG. 2 or JTAG circuit block 330 of FIG. 3) through interconnections 431 and 432.

VID IP block 400 includes control circuit block 410 and pulse-width modulation (PWM) block 320. Control circuit block 410 may receive information on the measured temperature and the voltage trimming levels through interconnections 421 and 431, respectively. Further, control circuit block 410 may trigger the temperature sensor block and JTAG circuit block through interconnections 422 and 432, respectively.

When VID IP block 400 is formed as part of a closed-loop circuit system (e.g., the closed-loop voltage regulating circuit system 300 of FIG. 3), control circuit block 410 may also receive voltage levels that are generated by a voltage regulator circuit through interconnections 451. In one embodiment, interconnections 451 may be coupled to an analog-to-digital converter (ADC) circuit block within voltage sensing circuitry (e.g., voltage sensing circuitry 350 of FIG. 3).

Control circuit block 410 may generate voltage identification (VID) code signals. In one embodiment, VID code signal may include at least N+1 bits. In one embodiment, the value of N may be 7. Hence, there may be 8 bits in a VID code signal. The VID code signal may be transmitted to PWM generator block 420. PWM generator block 420, upon receiving this VID code signal, may generate pulsed signals having a particular duty cycle. For example, a 2-bit VID code signal of '00' may request PWM generator block 420 to generate pulsed signals having a duty cycle, which inform the voltage regulator device (e.g., voltage regulator device 270 of FIG. 2 or voltage regulator device 370 of FIG. 3) to generate a nominal voltage level voltage signal. A 2-bit VID code of '01' may request PWM generator block 420 to generate pulsed signals having a different duty cycle, which inform the voltage regulator device to generate a voltage signal having a voltage level at least one voltage block greater than the nominal voltage value (e.g., 0.905 V). A VID code of '10' may request PWM generator block 420 to generate pulsed signals, which inform the voltage regulator device to generate a voltage signal having a voltage level at least one voltage block lower than the nominal voltage value (e.g., 0.895 V).

As shown in the embodiment of FIG. 4, PWM generator block 420 may receive an N+1 bits VID code signal. When the value of N is 7 (i.e., N+1=8), PWM generator 420 may be able to generate at least 256 different duty cycle pulsed signals. In one embodiment, PWM generator 420 may generate less than $2^N$ different types of duty cycle pulsed signals although PWM generator block 420 may be capable of generating at least $2^N$ different types of duty cycles for pulsed signals. For example, PWM generator 420 may generate only 64 different types of duty cycle pulsed signals although PWM generator block 420 may be capable of generating at least 256 (when N=7) different types of duty cycles for pulsed signals.

It should be appreciated that by changing the duty cycles to reflect each one of these bit variations, only a single wire is needed for communication between an integrated circuit device (e.g., integrated circuit device 100 of FIG. 1, integrated circuit device 210 of FIG. 2 or integrated circuit device 310 of FIG. 3) and a voltage regulator device (e.g., voltage regulator device 270 of FIG. 2 or voltage regulator device 370 of FIG. 3). Hence, such single-wire communication between the integrated circuit device and the voltage regulator may significantly reduce signal routing traffic congestion that is commonly a problem amongst latest generation circuit systems.

Figure 5:
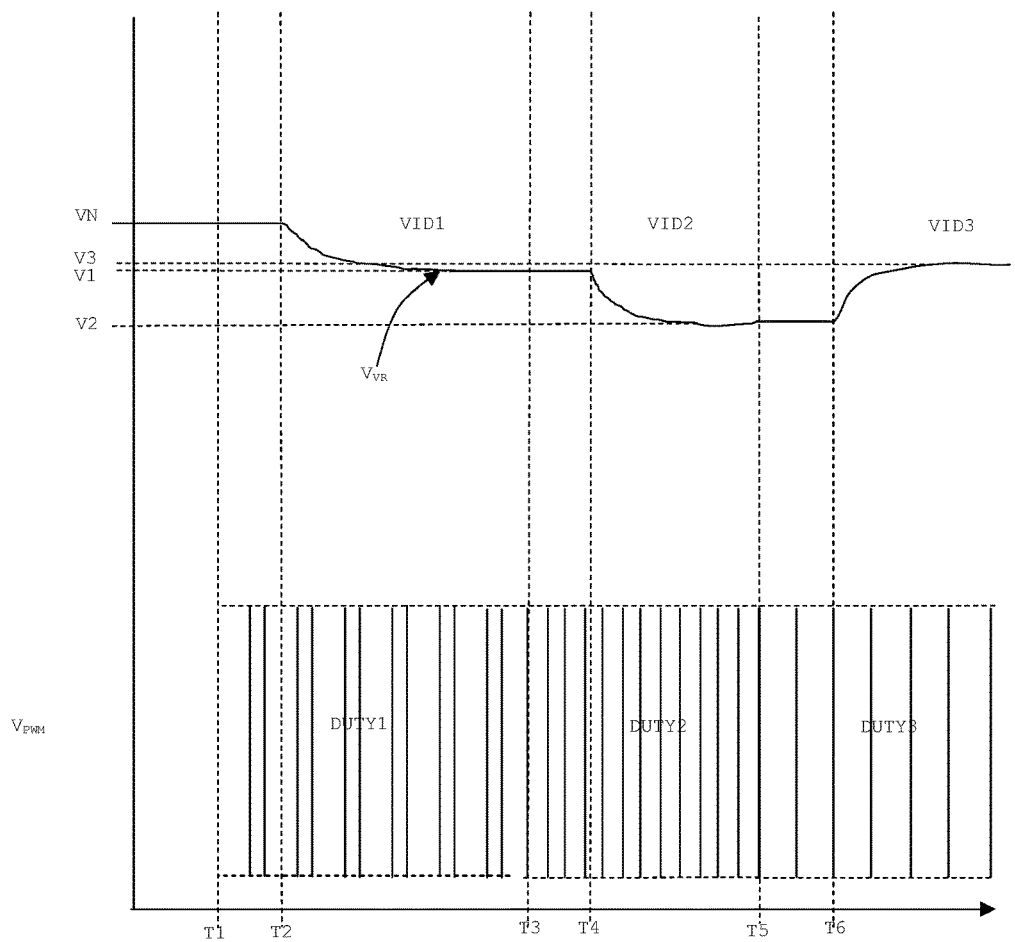
FIG. 5 shows illustrative plot charts of voltage levels of voltage signals changed according to different VID codes based on time in accordance with an embodiment.

FIG. 5, meant to be illustrative and not limiting, illustrates plot charts of voltage levels of a voltage signal changed according to different VID codes based on time in accordance with one embodiment of the present disclosure. The plot charts include (i) voltage levels of a voltage signal generated by a voltage regulator circuit ($V_{VR}$), and (ii) pulsed signals having different duty cycles ($V_{PWM}$). This plot reflects how different duty cycle pulsed signals may generate different voltage levels of the voltage signal at the voltage regulator circuit. In one embodiment, the pulsed signals are generated by an integrated circuit device (e.g., integrated circuit device 100 of FIG. 1, integrated circuit device 210 of FIG. 2 or integrated circuit device 310 of FIG. 3) having a VID IP block (e.g., VID IP block 290 of FIG. 2, VID IP block 390 of FIG. 3 or VID IP block 400 of FIG. 4). In addition to that, the voltage regulator device that receives the pulsed signals and generates the voltage levels may be similar to voltage regulator device 270 of FIG. 2 or voltage regulator device 370 of FIG. 3.

As shown in the embodiment in FIG. 5, the voltage regulator circuit may be supplying a nominal voltage level during the period 0 to T1. In one embodiment, the nominal voltage level may be at 0.9 V.

At T1, the integrated circuit device may generate pulsed signals having a DUTY1 duty cycle. In one embodiment, the pulsed signals having the DUTY1 duty cycle may be generated by the VID IP block. The VID code within the VID IP block may be a VID1. The pulsed signals having the DUTY1 duty cycle may be generated by the VID IP block based on a measured temperature, voltage trimming levels and/or a current voltage levels generated by the voltage regulator device.

Subsequently, the pulsed signals may be transmitted to the voltage regulator device using a single wire. Once the voltage regulator device receives the pulsed signals having the DUTY1 duty cycle, the voltage regulator device begins to generate voltage signals having voltage levels of V1 at T2. As shown in the embodiment of FIG. 5, voltage level V1 may be smaller than VN. The voltage regulator device continues to generate voltage signal having the voltage level of V1 until T4.

At T3, the integrated circuit device may generate pulsed signals having a DUTY2 duty cycle. The VID code within the VID IP block may be a VID2. In one exemplary embodiment, the pulsed signals having the DUTY2 duty cycle is generated when the temperature measured is lower than an expected temperature value. The pulsed signals having the DUTY2 duty cycle may correspond to a request to increase the voltage levels for the voltage signal generated by the voltage regulator device.

As shown in the embodiment of FIG. 5, the DUTY2 value may be higher than DUTY1 value as the pulsed signals having the DUTY2 duty cycle has a longer portions of logic high voltage in a signal period compared to the pulsed signals having the DUTY1 duty cycle.

Subsequently, the pulsed signals having a DUTY2 duty cycle may be transmitted to the voltage regulator device using the single wire. Once the voltage regulator device receives the pulsed signals having the DUTY2 duty cycle, the voltage regulator device begins to generate voltage signals having voltage levels of V2 at T4. As shown in the embodiment of FIG. 5, voltage level V2 may be smaller than VN and V1. The voltage regulator device continues to generate voltage signal having the voltage level of V2 until T6.

At T5, the integrated circuit device may generate pulsed signals having a DUTY3 duty cycle. The VID code within the VID IP block may be a VID3. In one exemplary embodiment, the pulsed signals having the DUTY3 duty cycle is generated when the temperature measured is higher than an expected temperature value. The pulsed signals having the DUTY3 duty cycle may correspond to a request to increase the voltage levels for the voltage signal generated by the voltage regulator device. In one embodiment, the DUTY3 value may be the largest compared to DUTY1 and DUTY2 values. Subsequently, the pulsed signals having a DUTY3 duty cycle may be transmitted to the voltage regulator device using the single wire. Once the voltage regulator device receives the pulsed signals having the DUTY3 duty cycle, the voltage regulator device begins to generate voltage signals having voltage levels of V4 at T6. As shown in the embodiment of FIG. 5, voltage level V3 may be smaller than VN however larger than V1 and V2.

Figure 6:
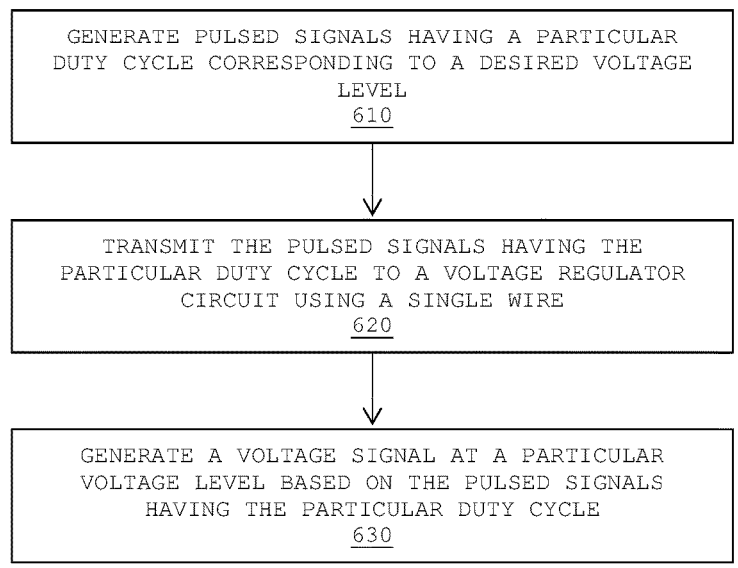
FIG. 6 shows a flowchart of an illustrative method on controlling a voltage regulator device in accordance with an embodiment.

FIG. 6, meant to be illustrative and not limiting, illustrates a flowchart of a method of controlling a voltage regulator device in accordance with one embodiment of the present disclosure. The voltage regulator device may be similar to voltage regulator device 270 of FIG. 2 or voltage regulator device 370 of FIG. 3. Voltage regulator device may be controlled by a control signal that is generated by an integrated circuit device. In one exemplary embodiment, the integrated circuit device may be similar to integrated circuit device 100 of FIG. 1, integrated circuit device 210 of FIG. 2 or integrated circuit device 310 of FIG. 3.

At block 610, pulsed signals having a particular duty cycle selected from a group of duty cycles are generated. The pulsed signals are generated by the integrated circuit device. In one embodiment, the pulsed signals at the particular duty cycle may be similar to the pulsed signals having the DUTY1 duty cycle, pulsed signals having the DUTY2 duty cycle or pulsed signals having the DUTY3 duty cycle as shown in the embodiment of FIG. 5.

In addition to that, the pulsed signals having the particular duty cycle may be selected from a group of 64 different types of duty cycles, in one embodiment. The pulsed signals may also be referred to as pulse-width modulated (PWM) signals.

At block 620, the pulsed signals having the particular duty cycle may be transmitted to the voltage regulator device using a single wire. The single wire may be similar to wire 261 of FIG. 2. In one embodiment, the pulsed signals may pass through a low pass filter (LPF) circuit before being received by the voltage regulator device. In one embodiment, the LPF circuit may be similar to LPF 260 of FIG. 2.

At block 630, a voltage signal of a particular voltage level is generated that corresponds to the pulsed signals of a particular duty cycle. In one embodiment, the voltage signal may be similar to $V_{Vr}$ as shown in the embodiment of FIG. 5. Hence, the voltage signal having the voltage level may be similar to $V_{Vr}$ that is shown between T2 to T4 (i.e., V1) when the pulsed signals have the DUTY1 duty cycle, the voltage signal having the voltage level may be similar to $V_{Vr}$ that is shown between T4 to T6 (i.e., V2) when the pulsed signals have the DUTY2 duty cycle or the voltage signal having the voltage level may be similar to $V_{Vr}$ that is shown T6 onwards (i.e., V3) when the pulsed signals have the DUTY3 duty cycle.

Figure 7:
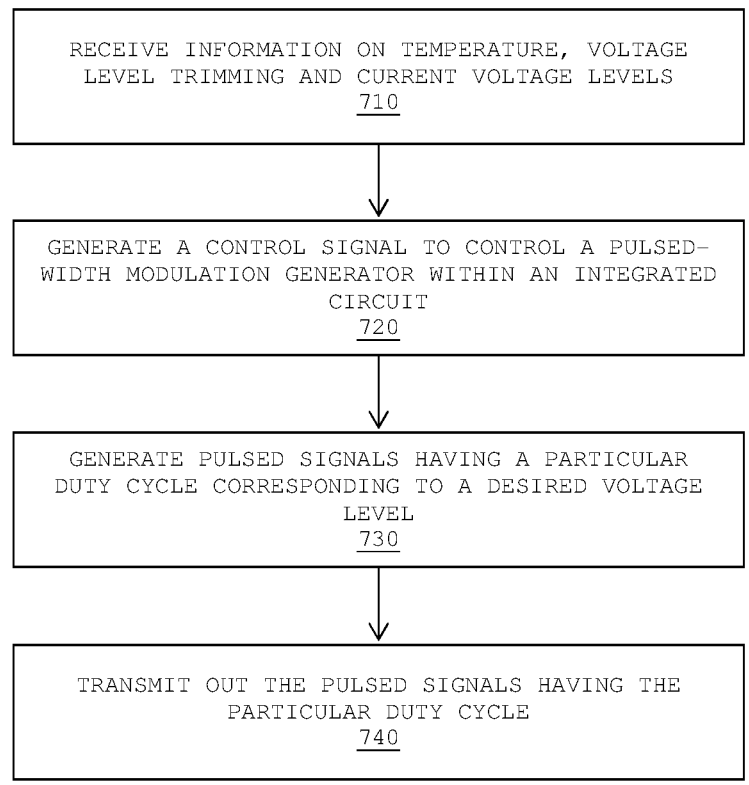
FIG. 7 shows a flowchart of an illustrative method on generating a control signal for a voltage regulator device in accordance with an embodiment.

FIG. 7, meant to be illustrative and not limiting, illustrates a flowchart of a method of generating a control signal for a voltage regulator device in accordance with one embodiment of the present disclosure.

Similar to FIG. 6, the voltage regulator device may be similar to voltage regulator device 270 of FIG. 2 or voltage regulator device 370 of FIG. 3. Each of these blocks 710-740 may be performed using an integrated circuit device (e.g., integrated circuit device 100 of FIG. 1, integrated circuit device 210 of FIG. 2 or integrated circuit device 310 of FIG. 3). The blocks 710-740 may be further understood when read together with VID IP block 400 of FIG. 4.

At block 710, information on measured temperature, voltage trimming levels and current voltage levels are received. In one embodiment, the information may be received by a VID IP block (e.g., VID IP block 290 of FIG. 2, VID IP block 390 of FIG. 3 or VID IP block 400 of FIG. 4). The measured temperature may be received from a temperature sensor (e.g., temperature sensor block 220 of FIG. 2 or temperature sensor block 320 of FIG. 3) and the voltage level trimming may be received from a JTAG circuit (e.g., JTAG circuit block 230 of FIG. 3 or JTAG circuit block 330 of FIG. 3). The current voltage levels may be received from an external voltage regulator device when the integrated circuit device forms part of a closed-loop voltage regulating system, in one embodiment. Alternatively, the VID IP block may not receive the current voltage level when the integrated circuit device forms an open-loop voltage regulating circuit system.

At block 720, a control signal that controls a pulse-width generator circuit is generated based on the information. In one embodiment, the control signal may be similar to the VID code signals (e.g., VID1, VID2 or VID3 code signals of FIG. 5). The control signal may be at least 8-bits long, in one embodiment. Each bit sequence may correspond to a particular duty cycle pulsed signals. For example, and as shown in the embodiment of FIG. 5, the VID1 code signal may correspond to the DUTY1 duty cycle pulsed signals.

At block 730, pulsed signals having a particular duty cycle that is selected from a group of defined duty cycles are generated. This block may be similar to block 610 of FIG. 6, and therefore for the sake of brevity, will not be repeated. However, in another embodiment, the pulsed signals having the particular duty cycle may be based on a particular function. The function may be similar to a linear function or an inverse function to the measured temperature, as stated in the embodiment of FIG. 2, for example.

At block 740, the pulsed signals having the particular duty cycle may be transmitted out. In one embodiment, the pulsed signal may be transmitted out of the VID IP block to an I/O circuit block (e.g., I/O circuit block 240 of FIG. 2 or I/O circuit block 340 of FIG. 3).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The invention claimed is:

1. An integrated circuit device comprising:
an input/output (I/O) interface;
a temperature sensor circuit configured to measure a temperature on the integrated circuit device;
a joint test action group (JTAG) circuit configured to generate a voltage level adjustment signal based on one or more fuses disposed on the integrated circuit device; and
voltage identification (VID) circuitry coupled to the input/output interface, the temperature sensor circuit, and the JTAG circuit, wherein the voltage identification circuitry generates a voltage identification signal based on the temperature and the voltage level adjustment signal, wherein the voltage identification signal comprises a pulsed signal having a particular duty cycle that corresponds to a specified voltage level to instruct a voltage regulator that receives the voltage identification signal via the I/O interface to provide an input voltage to the integrated circuit device at the specified voltage level.

2. The integrated circuit device of claim 1, wherein the voltage identification circuitry comprises:
a pulse-width modulation (PWM) generator circuit that generates the pulsed signal having the particular duty cycle from a group of defined duty cycle pulsed signals.

3. The integrated circuit device of claim 2, wherein the group of defined duty cycle pulsed signals include at least 64 different pulsed signals each having a different duty cycle.

4. The integrated circuit device of claim 2, wherein the voltage identification circuitry comprises:

a control circuit that is coupled to the pulse-width modulation generator circuit, wherein the control circuit generates a control signal to cause the pulse-width modulation generator circuit to generate the pulsed signals having the particular duty cycle.

5. The integrated circuit device as defined in claim 1, wherein the temperature sensor circuit is coupled to the voltage identification circuitry and generates a measured temperature signal comprising the temperature and transmits the measured temperature signal to the voltage identification circuitry.

6. The integrated circuit device of claim 5,
wherein the joint test action group (JTAG) circuit is coupled to the voltage identification circuitry and transmits the voltage level adjustment signal to the voltage identification circuitry.

7. The integrated circuit device of claim 1, comprising:
voltage sensing circuitry comprising an analog-to-digital converter (ADC) circuit, wherein the voltage sensing circuitry is coupled to the voltage identification circuitry and receives a voltage signal generated by the voltage regulator, wherein the voltage sensing circuitry transmit sensed voltage levels to the voltage identification circuitry.

8. A system, comprising:
an integrated circuit device that generates a pulsed signal having a particular duty cycle that is selected from a group of defined duty cycles; and
a voltage regulator circuit that is coupled to the integrated circuit device via a single control wire and receives the pulsed signal having the particular duty cycle from the integrated circuit device via the single control wire, wherein the voltage regulator circuit generates a voltage supply signal that corresponds to the particular duty cycle of the pulsed signal by decoding the pulsed signal to determine a particular voltage level that corresponds to the particular duty cycle.

9. The system of claim 8, wherein the integrated circuit device comprises:
a field programmable gate array (FPGA) device;
an application specific integrated circuit (ASIC) device;
an application specific standard product (ASSP) device; or
a combination thereof.

10. The system of claim 9, wherein the voltage regulator circuit generates the particular voltage level selected from a range of voltage levels between a lower voltage limit and an upper voltage limit based on the particular duty cycle of the pulsed signal.

11. The system of claim 9, comprising:
an additional voltage regulator circuit that is coupled to the integrated circuit device and receives another pulsed signal generated by the integrated circuit device and having another particular duty cycle, wherein the voltage regulator circuit generates another voltage supply signal that corresponds to the other particular duty cycle of the other pulsed signal.

12. The system of claim 8, wherein the group of defined duty cycles includes at least 64 different duty cycles.

13. The system of claim 8, wherein the integrated circuit device comprises:
a pulse-width modulation (PWM) generator circuit that generates the pulsed signal having the particular duty cycle; and
a control circuit that is coupled to the pulse-width modulation generator circuit, wherein the control circuit generates a control signal that is transmitted to the pulse-width modulation generator block to control generating of the pulsed signal having the particular duty cycle.

14. The system of claim 8, wherein the voltage regulator circuit transmits the voltage supply signal of the particular voltage level to the integrated circuit device, and wherein the integrated circuit device determines a difference between the voltage level of the voltage supply signal and a defined voltage level of the voltage supply signal, and generates the pulsed signal having the particular duty cycle based on the difference.

15. A method for operating an integrated circuit device to control a voltage regulator circuit, the method comprising:
using the integrated circuit device, generating a pulsed signal having a particular duty cycle that is based on information on temperature associated with the integrated circuit device and one or more voltage level adjustments based on one or more blown fuses within the integrated circuit device; and
using the integrated circuit device, transmitting the pulsed signal having the particular duty cycle to the voltage regulator.

16. The method of claim 15, wherein the integrated circuit device comprises a control circuit and a pulse-width modulation (PWM) generator circuit, wherein the method comprises:
using the control circuit, receiving the information on the temperature and the one or more voltage level adjustments;
using the control circuit, generating a control signal based on the temperature and the one or more voltage level adjustments; and
using the control circuit, transmitting the control signal to the pulse-width modulation generator circuit.

17. The method of claim 16, wherein the method comprises:
using the pulse-width modulation generator circuit, generating the pulsed signal having the particular duty cycle; and
using the pulse-width modulation generator circuit, transmitting the pulsed signal out from the integrated circuit device.

18. The method of claim 16, wherein the pulsed signal having the particular duty cycle is selected from a group of predefined pulsed signals having different duty cycles.

19. The method of claim 15, comprising using the integrated circuit device, receiving a voltage supply signal at a particular voltage level from a voltage regulator circuit;
wherein the particular function to generate the pulsed signal is based on a difference between the voltage signal of a particular voltage level and a predefined voltage level of the voltage signal.

20. The method of operating of claim 15, the method comprising:
using the integrated circuit device, generating another pulsed signal having another particular duty cycle that is based on the function; and
using the integrated circuit device, transmitting the other pulsed signal having the other particular duty cycle.

* * * * *